(12) United States Patent
Jun (10) Patent No.: US 10,727,359 B2
(45) Date of Patent: Jul. 28, 2020

(54) SOLAR CELL AND METHOD OF MANUFACTURING THEREFOR

(71) Applicant: Young Kwon Jun, Seoul (KR)

(72) Inventor: Young Kwon Jun, Seoul (KR)

( * ) Notice: Subject to any disclaimer, the term of this patent is extended or adjusted under 35 U.S.C. 154(b) by 0 days.

(21) Appl. No.: 14/442,727

(22) PCT Filed: Jun. 12, 2014

(86) PCT No.: PCT/KR2014/005144
§ 371 (c)(1),
(2) Date: May 14, 2015

(87) PCT Pub. No.: WO2014/204130
PCT Pub. Date: Dec. 24, 2014

(65) Prior Publication Data
US 2015/0287848 A1    Oct. 8, 2015

(30) Foreign Application Priority Data

Jun. 17, 2013  (KR) .................. 10-2013-0068897
Mar. 17, 2014  (KR) .................. 10-2014-0031121
Jun. 2, 2014   (KR) .................. 10-2014-0066764

(51) Int. Cl.
*H01L 31/06*    (2012.01)
*H01L 31/18*    (2006.01)
(Continued)

(52) U.S. Cl.
CPC ...... *H01L 31/022425* (2013.01); *H01L 31/06* (2013.01); *H01L 31/075* (2013.01);
(Continued)

(58) Field of Classification Search
CPC ..... H01L 31/032; H01L 31/078; H01L 31/18; H01L 31/0327; H01L 31/0296;
(Continued)

(56) References Cited

U.S. PATENT DOCUMENTS 3,855,004 A * 12/1974 Brody .................. H01L 31/06
                                                    136/254
7,705,523 B2   4/2010 Wang et al.
(Continued)

FOREIGN PATENT DOCUMENTS

KR   10-0786855 B1    12/2007
KR   2011-0087226 A    8/2011
(Continued)

OTHER PUBLICATIONS

Hanninen et al, [Ca(Thd)2(Tetraen)]: A Monomeric Precursor for Deposition of CaS Thin Films, May 1997, Chem. Mater. 9 1234-1240.*
(Continued)

*Primary Examiner* — Andrew J Golden
(74) *Attorney, Agent, or Firm* — Revolution IP, PLLC (57) ABSTRACT

The present invention relates to a structure of a solar cell for improving photoelectric conversion efficiency of the solar cell, and a manufacturing method therefor. One aspect of the solar cell according to the present invention relates to a solar cell having a light-absorbing layer formed between two electrodes arranged to face each other, wherein an electrical polarization layer comprising an electrical polarization material forming an inner electrical field is formed between the electrodes and the light-absorbing layer.

14 Claims, 6 Drawing Sheets

(51) Int. Cl.
  *H01L 31/0224*   (2006.01)
  *H01L 31/0749*   (2012.01)
  *H01L 31/075*    (2012.01)
  *H01L 31/032*    (2006.01)

(52) U.S. Cl.
  CPC .......... *H01L 31/0749* (2013.01); *H01L 31/18* (2013.01); *H01L 31/0322* (2013.01); *H01L 31/0326* (2013.01); *Y02E 10/541* (2013.01); *Y02P 70/521* (2015.11)

(58) Field of Classification Search
  CPC ........... H01L 31/02966; H01L 31/0322; H01L 31/0326; H01L 31/022425
  USPC .................................................. 136/243–265
  See application file for complete search history.

(56) References Cited

U.S. PATENT DOCUMENTS

| | | | |
|---|---|---|---|
| 2003/0037815 A1* | 2/2003 | Kim ...................... | H01L 31/068 136/256 |
| 2004/0040494 A1* | 3/2004 | Vaartstra ........... | H01L 21/31691 117/104 |
| 2008/0149176 A1* | 6/2008 | Sager .................. | H01L 31/0322 136/262 |
| 2010/0180950 A1* | 7/2010 | Gao ...................... | B82Y 10/00 136/265 |
| 2010/0270592 A1* | 10/2010 | Ahn ...................... | B82Y 20/00 257/201 |
| 2012/0017976 A1 | 1/2012 | Nechache et al. | |
| 2013/0048059 A1 | 2/2013 | Han et al. | |
| 2013/0104969 A1 | 5/2013 | Rappe et al. | |
| 2014/0193626 A1 | 7/2014 | Özyilmaz et al. | |

FOREIGN PATENT DOCUMENTS

| | | |
|---|---|---|
| KR | 10-1159277 B1 | 6/2012 |
| WO | 2012-064285 A1 | 5/2012 |

OTHER PUBLICATIONS

International Search Report for PCT/KR2014/005144 dated Oct. 29, 2014 from Korean Intellectual Property Office.

\* cited by examiner

SOLAR CELL AND METHOD OF MANUFACTURING THEREFOR

CROSS REFERENCE TO PRIOR APPLICATIONS

This application is a National Stage Application of PCT International Patent Application No. PCT/KR2014/005144 filed Jun. 12, 2014, under 35 U.S.C. §371, which claims priority to Korean Patent Application Nos. 10-2013-0068897 filed Jun. 17, 2013, 10-2014-0031121 filed Mar. 17, 2014 , and 10-2014-0066764 filed Jun. 2, 2014, which are all hereby incorporated by reference in their entirety.

TECHNICAL FIELD

The present invention relates to a solar cell and a method of manufacturing the same, and more particularly, to a structure of a solar cell, in which photoelectric conversion efficiency of the solar cell is improved by disposing an electrical polarization layer, which forms a built-in electric field due to spontaneous polarization and/or remnant polarization characteristics, adjacent to a light-absorbing layer in a crystalline silicon solar cell as well as a thin film solar cell such as a Cu(In,Ga)Se$_2$ (CIGS) solar cell and a dye-sensitized solar cell, and a method of manufacturing the same.

BACKGROUND ART

A thin film solar cell technique is an advanced solar cell technique that is compared to a technique of crystalline silicon (Si) solar cell which currently has the largest market share, wherein the thin film solar cell has a higher efficiency than the crystalline Si solar cell and may be manufactured at a lower cost.

Various types of thin film solar cells have been developed and a typical example thereof may be a Cu(In,Ga)Se$_2$ (CIGS) solar cell.

The CIGS solar cell denotes a cell that is composed of general glass substrate-back electrode-light-absorbing layer-buffer layer-front transparent electrode, in which the light-absorbing layer absorbing sunlight is formed of CIGS or CuIn(S,Se)$_2$ (CIS). Since the CIGS is more widely used among the CIGS or the CIS, the CIGS solar cell will be described hereinafter.

Since CIGS, as a group I-III-VI chalcopyrite-based compound semiconductor, has a direct transition type energy bandgap and a light absorption coefficient of about $1\times10^5$ cm$^{-1}$ which is one of the highest among semiconductors, the CIGS is a material capable of manufacturing a high-efficiency solar cell even with a 1 μm to 2 μm thick thin film.

Since the CIGS solar cell has electro-optically excellent long-term stability even at outdoors and excellent resistance to radiation, the CIGS solar cell is suitable for a spacecraft solar cell.

In general, glass is used as a substrate of the CIGS solar cell, but the CIGS solar cell may be manufactured in the form of a flexible solar cell by being deposited on a polymer (e.g., polyimide) or a metal thin film (e.g., stainless steel, titanium (Ti)) substrate in addition to the glass substrate. In particular, the CIGS solar cell, as a low-cost, high-efficiency thin film solar cell, has been known as a solar cell having a very high commercialization potential which may replace a crystalline silicon solar cell, as the highest energy conversion efficiency of 19.5% among thin film solar cells has been recently realized.

CIGS may be used by replacing cations, such as copper (Cu), Indium (In), and gallium (Ga), and an anion, such as selenium (Se), respectively with other metal ions or anions, and these materials may be collectively referred to as a CIGS-based compound semiconductor. A representative compound of the CIGS is Cu(In,Ga)Se$_2$, and the CIGS-based compound semiconductor is a material in which its energy bandgap as well as crystal lattice constant may be adjusted by changing types and compositions of constituting cations (e.g., Cu, silver (Ag), In, Ga, aluminum (Al), zinc (Zn), germanium (Ge), tin (Sn), etc.) and anions (e.g., Se and sulfur (S)).

Thus, a light-absorbing layer formed of a similar compound semiconductor material including a CIGS material may also be used. The light-absorbing layer may include a compound which includes M1, M2, X, and a combination thereof (where M1 is Cu, Ag, or a combination thereof, M2 is In, Ga, Al, Zn, Ge, Sn, or a combination thereof, and X is Se, S, or a combination thereof). Recently, for example, a material, such as Cu$_2$ZnSnS$_4$ (CZTS) or Cu$_2$Sn$_x$Ge$_y$S$_3$ (CTGS), may also be used as a low-cost compound semiconductor material (where x and y are arbitrary prime numbers).

Even in a typical thin film solar cell, a technique for further increasing efficiency through a combination with a piezoelectric device has been developed.

For example, the following Patent Document 1 by Wang et al. suggests a method of improving efficiency of a hybrid solar nanogenerator, in which a charge generated by mechanical vibration is collected by installing a piezoelectric nanogenerator using a ZnO nanowire on an electrode of a dye-sensitized solar cell in series or in parallel to contribute to power generation with photocurrent. However, since a technique disclosed in the following Patent Document 1 additionally requires energy and equipment to generate the mechanical vibration, economic efficiency may be reduced.

Also, in the following Patent Document 2, a solar cell technique capable of improving light conversion efficiency by an electric-field enhancement effect is disclosed in which the technique is for improving photoelectric conversion efficiency of a solar cell by effectively transferring electrons and holes, which are generated from a photoactive layer due to the light, by installing a field emission layer, which includes a nanostructure in the form of a nanorod, a nanowire, or a nanotube having a field emission effect, on an electrode of the thin film solar cell. However, as a result of being applied to various actual thin film solar cells, an efficiency improvement effect may be insignificant and processing costs for fabricating the nanostructure may be increased. Thus, similar to the technique disclosed in Patent Document 1, economic efficiency may be reduced.

Patent Documents

1. U.S. Pat. No. 7,705,523 (2010.4.27)
2. Korean Patent Application Laid-Open Publication No. 2011-0087226 (2011.8.2)

DISCLOSURE OF THE INVENTION

Technical Problem

The purpose of the present invention is to provide a novel structure of a solar cell capable of further improving photoelectric conversion efficiency of a typical thin film solar cell or a conventional solar cell, and a manufacturing method thereof.

The purpose of the present invention is also to provide an economical structure of a solar cell capable of improving photoelectric conversion efficiency with no or less additional processing costs, particularly different from a hybrid piezoelectric power generation type solar cell or a solar cell using a field emission layer electrode, and a manufacturing method thereof.

The purpose of the present invention is also to provide a structure of a solar cell capable of increasing efficiency by reducing the recombination of electrons and holes, which are generated in a p-n junction semiconductor due to optical absorption, and simultaneously improving collection efficiency of an electrode through the formation of a built-in electric field by disposing an electrical polarization material having spontaneous polarization or remnant polarization characteristics adjacent to a light-absorbing layer, and a manufacturing method thereof.

Technical Solution

According to an embodiment of the present invention, there is provided a solar cell having a light-absorbing layer formed between two electrodes which are disposed to face each other, wherein an electrical polarization layer, which includes an electrical polarization material forming a built-in electric field, is formed between the electrodes and the light-absorbing layer.

According to another embodiment of the present invention, there is provided a compound semiconductor solar cell having a light-absorbing layer formed between two electrodes which are disposed to face each other and having a buffer layer formed on one surface of the light-absorbing layer, wherein the buffer layer includes an electrical polarization material forming a built-in electric field.

According to another embodiment of the present invention, there is provided a solar cell having a light-absorbing layer formed between two electrodes which are disposed to face each other, wherein the light-absorbing layer includes an electrical polarization material forming a built-in electric field.

According to another embodiment of the present invention, there is provided a solar cell having a light-absorbing layer formed between two electrodes which are disposed to face each other, wherein an electrical polarization layer, which includes an electrical polarization material forming a built-in electric field, is connected to at least one electrode of the solar cell in series.

The electrical polarization material may have spontaneous polarization characteristics.

The electrical polarization material may have remnant polarization characteristics.

The electrical polarization material may be a ferroelectric or a composite material including the ferroelectric.

The electrical polarization material may be an antiferroelectric or a composite material including the antiferroelectric.

The electrical polarization material may have a perovskite crystal structure.

Two or more electrical polarization layers may be formed adjacent to the two electrodes.

The electrical polarization material may have characteristics of a tunneling dielectric or a capacitor.

The electrical polarization material may include a material having a bandgap energy of 2.54 eV or less.

The electrical polarization layer may have a thickness of 10 nm to 100 nm.

The light-absorbing layer may include a compound which includes M1, M2, X, and a combination thereof (where M1 is copper (Cu), silver (Ag), or a combination thereof, M2 is indium (In), gallium (Ga), aluminum (Al), zinc (Zn), germanium (Ge), tin (Sn), or a combination thereof, and X is selenium (Se), sulfur (S), or a combination thereof).

The ferroelectric may include at least one selected from the group consisting of $BaTiO_3$ (BTO), $PbZrTiO_3$ (PZT), $SrTiO_3$, $CaTiO_3$, $CuTiO_3$, $KTaO_3$, $KNbO_3$, $NaNbO_3$, $LiNbO_3$, $ZrHfO_2$, $BiFeO_3$, and tourmaline.

The antiferroelectric may include at least one selected from the group consisting of $ZrPbO_3$, $NH_4H_2PO_4$, $(NH_4)_2H_3IO_6$, and $Cu(HCOO)_2 \cdot 4H_2O$.

The material having a perovskite crystal structure may include at least one selected from the group consisting of CCTO ($CaCu_3Ti_4O_{12}$), $(Mg,Fe)SiO_3$, and $CaSiO_3$.

The light-absorbing layer may include at least one of a p-type semiconductor, an n-type semiconductor, and an i-type (intrinsic) semiconductor.

According to another embodiment of the present invention, there is provided a method of manufacturing a solar cell having a light-absorbing layer formed between two electrodes which are disposed to face each other including forming an electrical polarization layer, which includes an electrical polarization material forming a built-in electric field, between the electrodes and the light-absorbing layer or in the light-absorbing layer.

The built-in electric field may be increased by applying an electric field to both ends of the electrical polarization layer.

The electric field applied to increase the built-in electric field may be less than a reverse breakdown voltage of the solar cell.

The electrical polarization layer may be formed by physical vapor deposition (PVD), chemical vapor deposition (CVD), atomic layer deposition (ALD), or a wet coating method.

In a case where the electrical polarization layer is formed by the atomic layer deposition, the electrical polarization layer may be formed by a process including: adsorbing any one or both of a calcium (Ca) compound precursor material and a copper (Cu) compound precursor material, and a titanium (Ti) compound precursor material to the light-absorbing layer; and forming an adsorption layer of the precursor materials as an oxide by an oxidation reaction.

The Ca compound precursor material may include at least one selected from $Ca(Thd)_2$ (Tetraen) and $Ca_3(thd)_6$.

The Cu compound precursor material may include at least one selected from the group consisting of Cu(hfac)(tmvs)[=$C_{10}H_{13}CuF_6O_2Si$], $Cu(hfac)_2$[=Cu$(CF_3COCHCOCF_3)_2$], (hfac)Cu(DMB)[=Cu$(CF_3COCHCOCF_3)[CH_2CHC(CH_3)_3]$], and Cu(ethylketoiminate)$_2$[=Cu$(CH_3COCHCN(CH_2CH_3)CH_3)]_2$].

The Ti compound precursor material may include at least one selected from Ti(O-iPr)$_2$(DPM)$_2$[=Ti$(C_3H_7O)_2$$(C_{11}H_{19}O_2)_2$] and TiO(thd)$_2$[=TiO$(C_{11}H_{20}O_2)_2$].

The electrical polarization layer may be formed by a process including: forming a metal oxide layer on one surface of the light-absorbing layer; and causing a chemical reaction between the light-absorbing layer and the metal oxide layer.

The metal oxide layer may be formed by physical vapor deposition (PVD), chemical vapor deposition (CVD), or atomic layer deposition (ALD).

The metal oxide layer may be formed by atomic layer deposition using a precursor material including Ti.

The precursor material including Ti may include tetrakis(dimethylamino)titanium, tetrakis(diethylamido)titanium, tetrakis(ethylmethylamido)titanium, titanium tetraisopropoxide, or a combination thereof.

The wet coating method may include at least one selected from the group consisting of chemical bath deposition, spin coating, doctor-blade coating, drop-casting, screen printing, and inkjet printing.

The wet coating method may include: preparing a solution in which a metal oxide is dissolved; coating the solution; and performing a heat treatment.

The metal oxide may be a compound including Ti.

The metal oxide may be a compound including Ti and Cu.

Advantageous Effects

In a solar cell according to the present invention, since an electrical polarization layer, in which a built-in electric field is formed by spontaneous polarization or remnant polarization, is disposed adjacent to a light-absorbing layer of the solar cell, the recombination of electrons and holes, which are generated in a p-n junction semiconductor due to optical absorption, may be reduced and collection efficiency of an electrode may be simultaneously improved through the built-in electric field to increase photoelectric conversion efficiency.

Also, with respect to a CIGS thin film solar cell according to an aspect of the present invention, in a case where an electrical polarization layer is formed by replacing a typical buffer layer, a CIGS thin film solar cell capable of improving photoelectric conversion efficiency as well as minimizing additional processing costs may be manufactured.

With respect to a solar cell according to another aspect of the present invention, in a case where a light-absorbing layer is formed by including a material capable of implementing electrical polarization characteristics as well as absorbing light, a solar cell capable of improving photoelectric conversion efficiency as well as minimizing additional processing costs may be manufactured.

Furthermore, a solar cell according to the present invention may not only be used in a thin film solar cell, but may also be used in a typical crystalline silicon solar cell.

MODE FOR CARRYING OUT THE INVENTION

Hereinafter, the configuration and operation of embodiments of the present invention will be described with reference to the accompanying drawings.

In describing the present invention, detailed descriptions related to well-known functions or configurations will be ruled out in order not to unnecessarily obscure subject matters of the present invention. Furthermore, when it is described that one "includes" some elements, it should be understood that it may include only those elements, or it may include other elements as well as those elements if there is no specific limitation. In the accompanying drawings, the sizes and thicknesses of films (layers) or regions are exaggerated for clarity of illustration.

Figure 1:
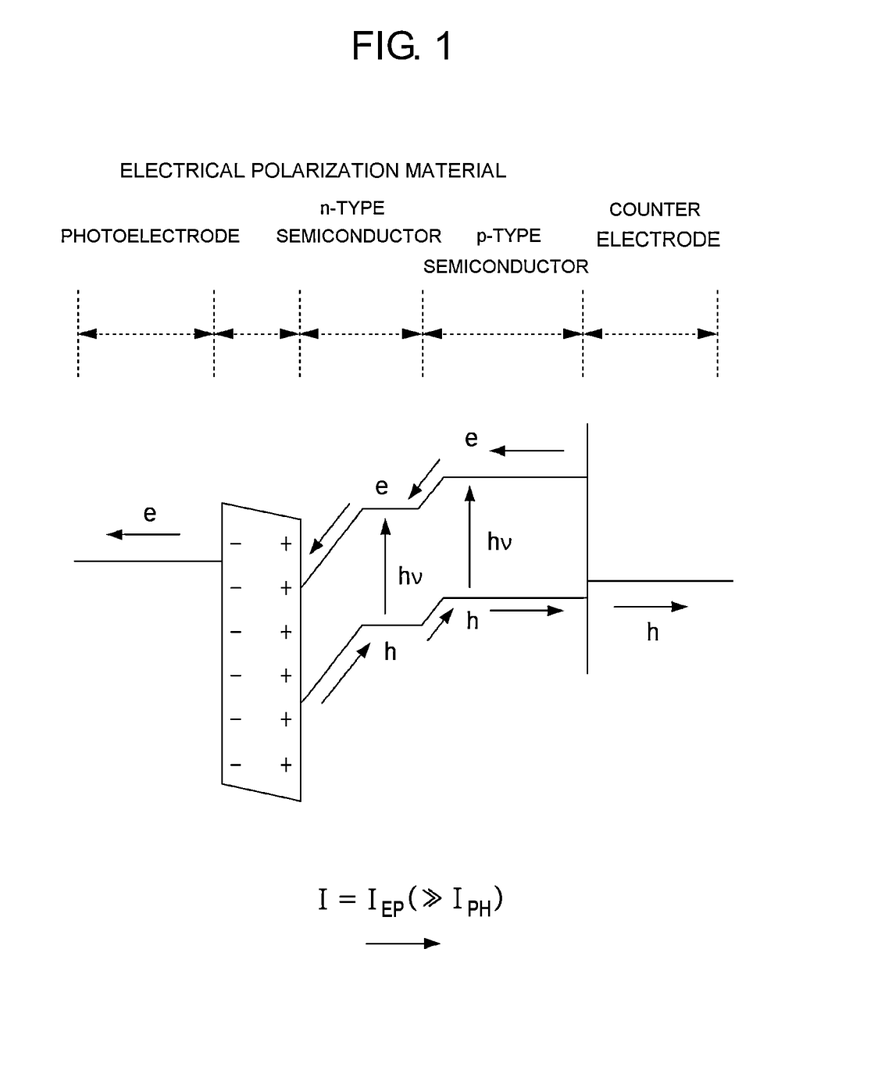
FIG. 1 illustrates an effect of increasing photocurrent in a solar cell in which an electrical polarization layer generating a built-in electric field is disposed between an electrode and a light-absorbing layer.

As a result of research conducted into a method of improving photoelectric conversion efficiency while minimizing additional costs, the present inventors recognized that, in a case where an electrical polarization material layer having a built-in electric field formed therein is inserted between a light-absorbing layer and an electrode of a solar cell, the built-in electric field, as illustrated in FIG. 1 (In FIG. 1, $I_{EP}$ represents a current when the electrical polarization layer is present and $I_{PH}$ represents a current when the electrical polarization layer is absent), has an effect of applying an electric field to electrons and holes, as charge carriers generated in a semiconductor by photoexcitation, in a forward direction (direction of anode, at which the electrons are collected, with respect to the electrons) to reduce the recombination of the electrons and holes and simultaneously improve collection efficiency of the electrode, thereby leading to the completion of the present invention.

Figure 2:
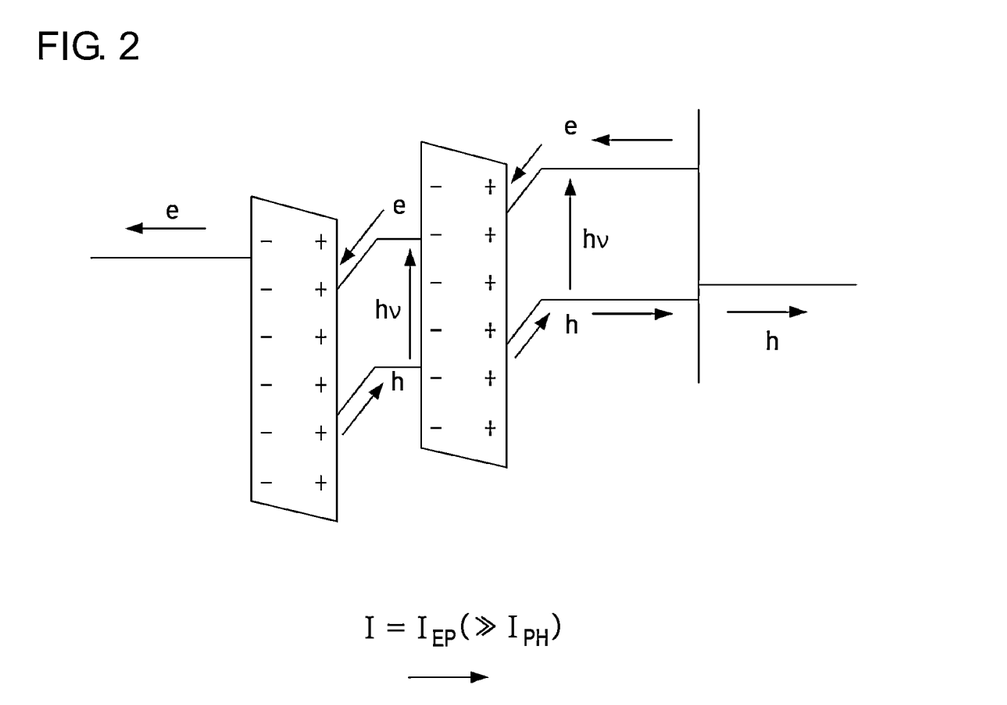
FIG. 2 illustrates an effect of increasing photocurrent in a solar cell, in which, when a light-absorbing layer is formed of multiple layers, an electrical polarization layer generating a built-in electric field is disposed between the multiple light-absorbing layers.

Also, as illustrated in FIG. 2 (In FIG. 2, $I_{EP}$ represents a current when the electrical polarization layer is present and $I_{PH}$ represents a current when the electrical polarization layer is absent), in a case where the light-absorbing layer is formed in a multilayer structure, the effect of reducing the recombination of the electrons and holes may be obtained when the electrical polarization layer is disposed between individual layers.

Figure 3:
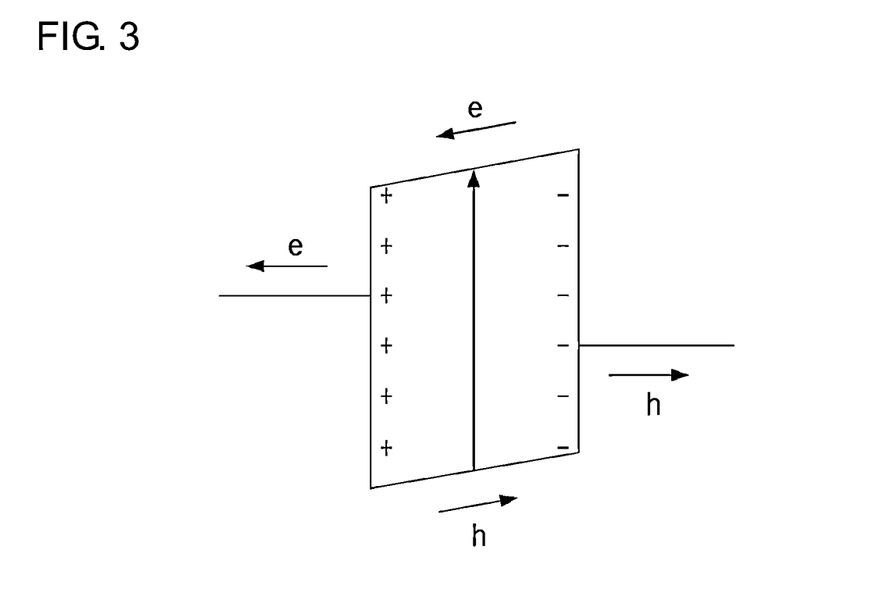
FIG. 3 illustrates an effect of increasing photocurrent in a solar cell, in which a light-absorbing layer, which includes a material capable of forming an electrical polarization layer generating a built-in electric field, is formed.

Furthermore, as illustrated in FIG. 3, in a case where the light-absorbing layer is formed of a material capable of implementing electrical polarization as well as absorbing light, the recombination of the electrons and holes may be reduced without forming a separate additional layer.

Figure 4:
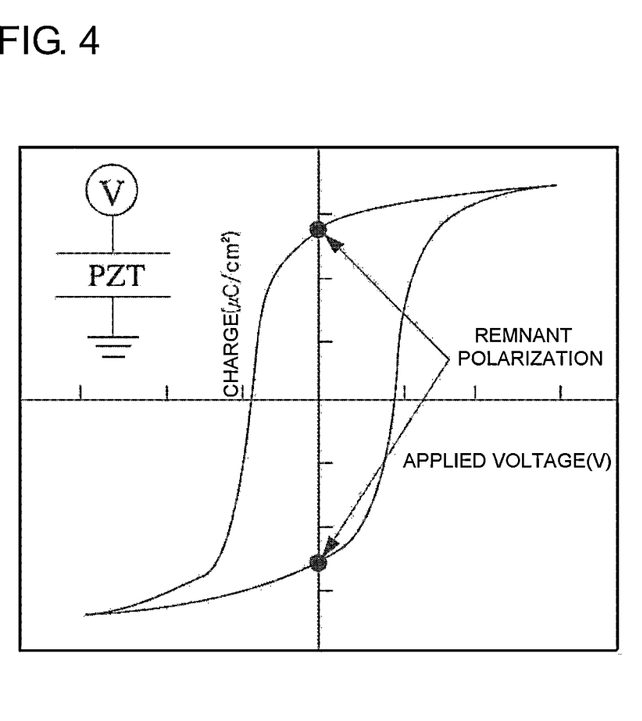
FIG. 4 illustrates a lattice structure and a hysteresis curve in a case where a ferroelectric, such as a piezoelectric (PZT) device, is used as an electrical polarization material according to an embodiment of the present invention.

FIG. 4 illustrates a lattice structure and an electric hysteresis loop of a ferroelectric, such as lead zirconium titanate (PZT, $PbZrTiO_3$), as an example of an electrical polarization material. As illustrated in FIG. 4, since PZT may have spontaneous polarization characteristics and remnant polarization may occur even after an external electric field is removed in a case where a metal atom (titanium (Ti) or zirconium (Zr)) located at the center of the left figure is displaced up or down by the external electric field, the PZT may form a built-in electric field.

Figure 5A:
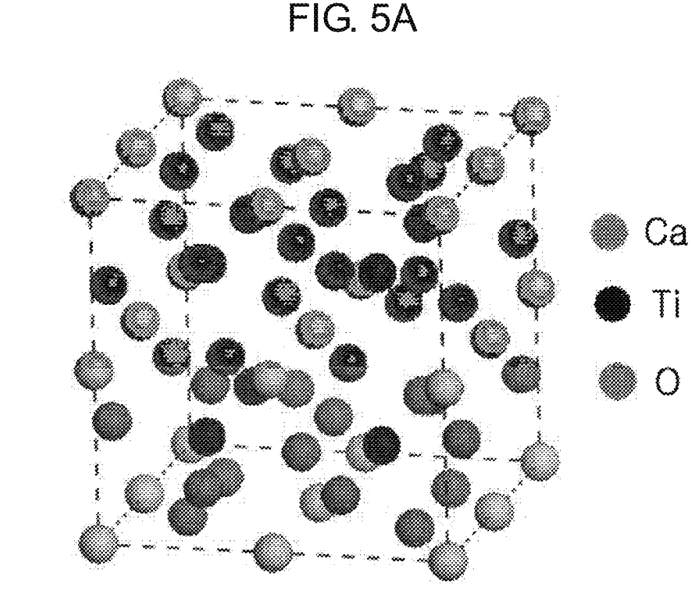
FIGS. 5A and 5B respectively illustrate perovskite lattice structures of $CaTiO_3$ and $CuTiO_3$ which are used as the electrical polarization material according to the embodiment of the present invention.
Figure 5B:
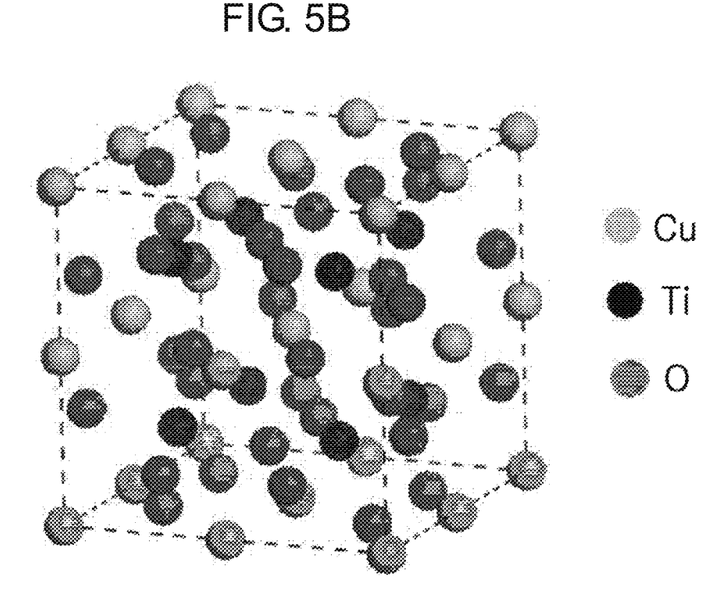

FIGS. 5A and 5B respectively illustrate lattice structures of $CaTiO_3$ and $CuTiO_3$ having a perovskite structure, as another example of the electrical polarization material, wherein both materials exhibit spontaneous polarization and remnant polarization characteristics and a solar cell according to the present invention is characterized in that such materials are disposed between an electrode layer and a light-absorbing layer.

Figure 6:
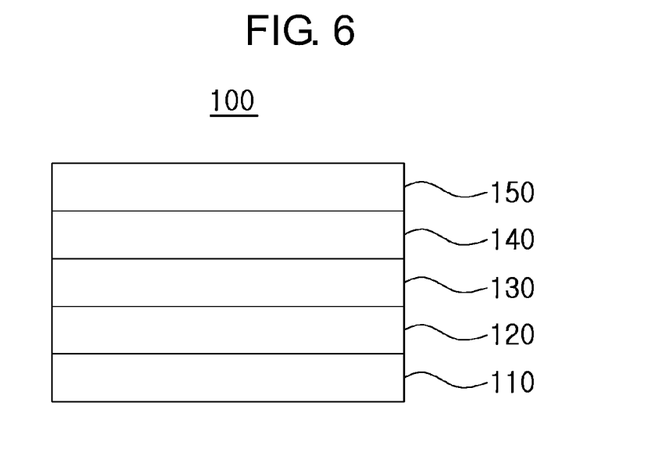
FIG. 6 illustrates a structure of a solar cell according to an embodiment of the present invention.

FIG. 6 schematically illustrates a structure of a solar cell according to an embodiment of the present invention.

As illustrated in FIG. 6, a thin film solar cell 100 according to the embodiment of the present invention may include a substrate 110, a lower electrode 120, a light-absorbing layer 130, an electrical polarization layer 140, and an upper electrode 150.

As the substrate 110, any substrate, such as a glass substrate including soda-lime glass (SLG), a ceramic substrate, a metal substrate including a stainless steel substrate, and a polymer substrate, may be used as long as it is used in the art.

The lower electrode 120 and the upper electrode 150 are respectively electrodes for receiving electrons and holes, which are generated by photoelectric effect, and transferring the electrons and holes to the outside. In particular, the upper electrode 150 may be formed of a transparent electrode which is formed of a conductive transparent material. For example, a transparent conductive oxide, such as ITO, FTO, ZnO, ATO, PTO, AZO, and IZO, or a material, such as chalcogenide, may be used as the transparent electrode, and any material may be used without limitation as long as it may obtain characteristics of the lower electrode 120 and the upper electrode 150 of the present invention.

The light-absorbing layer 130 is formed by laminating at least one n-type semiconductor layer and at least one p-type semiconductor layer, wherein a light-absorbing layer may be further included between the n-type semiconductor layer and the p-type semiconductor layer. The n-type semiconductor layer and the p-type semiconductor layer may include a compound semiconductor which includes an inorganic material, an organic material, an organic metal compound, an organic inorganic composite, or a combination thereof, but the present invention is not limited thereto.

The electrical polarization layer 140 is a layer for reducing the recombination of electrons and holes by applying an electric field to the electrons and holes, as charge carriers generated in a semiconductor of the light-absorbing layer 130 by photoexcitation, in a forward direction through the formation of a built-in electric field by spontaneous polarization and/or remnant polarization phenomenon, wherein any electrical polarization material may be used without limitation as long as it may form a built-in electric field by the spontaneous polarization and/or remnant polarization phenomenon. Examples of the electrical polarization material may be ferroelectrics or a composite material thereof, antiferroelectrics or a composite material thereof, or a material having a perovskite structure.

The electrical polarization layer 140 may increase a forward electric field with respect to charge carriers, which are generated by photoexcitation, by increasing remnant polarization when the forward electric field is applied to both ends of the electrical polarization layer using an external voltage source in addition to the spontaneous polarization characteristics.

Examples of the ferroelectric may be $BaTiO_3$ (BTO), $PbZrTiO_3$ (PZT), $SrTiO_3$, $CaTiO_3$, $CuTiO_3$, $KTaO_3$, $KNbO_3$, $NaNbO_3$, $LiNbO_3$, $ZrHfO_2$, $BiFeO_3$, and tourmaline, and examples of the antiferroelectric may be $ZrPbO_3$, $NH_4H_2PO_4$, $(NH_4)_2H_3IO_6$, and $Cu(HCOO)_2.4H_2O$, but the present invention is not limited thereto. Also, a material exhibiting remnant polarization characteristics, such as CCTO ($CaCu_3Ti_4O_{12}$), may be used even if it is not a ferroelectric or an antiferroelectric.

It is desirable to form a thickness of the electrical polarization layer 140 in a range of 10 nm to 100 nm. The reason for this is that, in the case that the thickness is less than 10 nm, a field effect due to the electrical polarization layer is reduced, and in the case in which the thickness is greater than 100 nm, the field effect is increased but series resistance increases because a distance, through which electrons or holes move to the electrode, is increased.

Figure 7:
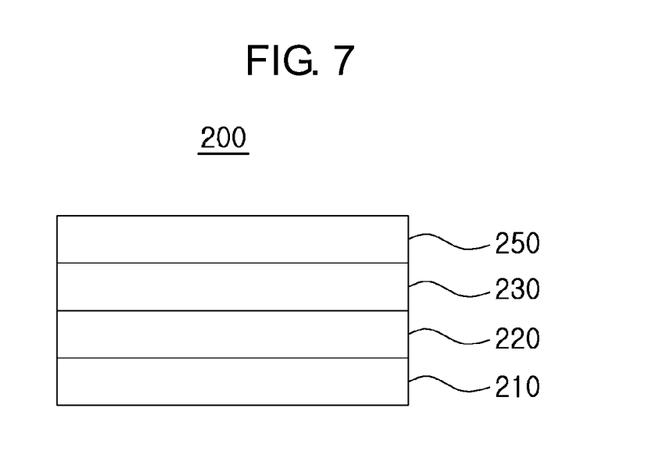
FIG. 7 illustrates a structure of a solar cell according to another embodiment of the present invention.

FIG. 7 schematically illustrates a structure of a solar cell according to another embodiment of the present invention.

As illustrated in FIG. 7, a thin film solar cell 200 according to the another embodiment of the present invention may include a substrate 210, a lower electrode 220, a light-absorbing layer 230 including an electrical polarization material, and an upper electrode 250.

That is, the another embodiment of the present invention is characterized in that the electrical polarization layer 140 and the light-absorbing layer 130 of the above one embodiment are formed of a single layer. The thin film solar cell having the above structure may further simplify a manufacturing process.

In a case where the electrical polarization layer is also used as a light-absorbing layer, the light-absorbing layer may be composed of one material of a p-type semiconductor, an n-type semiconductor, and an i-type (intrinsic) semiconductor, or a combination thereof.

For example, a bandgap energy of $TiO_2$ is about 3.0 eV to about 3.2 eV in which ultraviolet absorption and photoexcitation are possible, and since the bandgap energy may decrease to 1.25 eV as an impurity element is added, visible light absorption may also be possible.

In particular, with respect to oxides including copper (Cu) or calcium (Ca) and Ti which have electrical polarization characteristics, the oxides are known to have the following bandgap energies, e.g., $CuTiO_3$: 0.53 eV, $CaCu_3Ti_4O_{12}$: 0.57 eV, $Ca_2Cu_2Ti_4O_{12}$: 1.22 eV, $Ca_3CuTi_4O_{12}$: 2.30 eV, and $CaTiO_3$: 2.20 to 2.54 eV, and the oxides including Cu and Ti may also absorb visible light and infrared ray according to compositions thereof.

Accordingly, since the electrical polarization layer itself may also function as a light-absorbing layer, the light-absorbing layer and the electrical polarization layer may be integrated and used.

Figure 8:
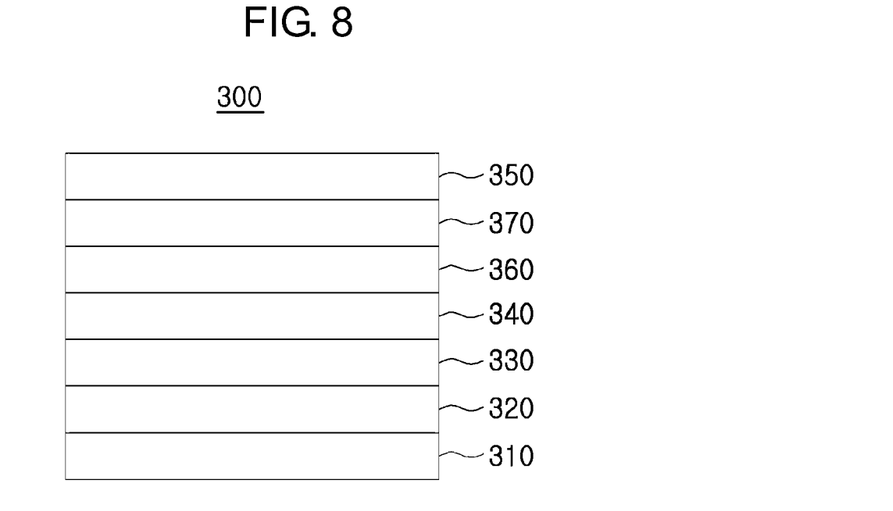
FIG. 8 illustrates a structure of a CIGS thin film solar cell according to another embodiment of the present invention.

FIG. 8 schematically illustrates a structure of a CIGS thin film solar cell according to another embodiment of the present invention.

As illustrated in FIG. 8, a thin film solar cell 300 according to the another embodiment of the present invention may include a substrate 310, a lower electrode 320, a light-absorbing layer 330, an electrical polarization layer 340, a buffer layer 360, a window layer 370, and an upper electrode 350.

Similar to a typical CIGS thin film solar cell, a CdS thin film may be used as the buffer layer 360, but the present invention is not limited thereto.

The window layer 370 has a sufficiently large bandgap so that it functions to increase the intensity of visible light reaching the light-absorbing layer and simultaneously reduce resistance in order for electrons to be collected at the electrode, and as non-limiting examples, ZnO or doped ZnO may be used.

Although the buffer layer 360 is formed on the electrical polarization layer 340 in FIG. 8, the buffer layer 360 may be replaced with the electrical polarization layer 340 because it is more economical not to use the buffer layer 360 due to the electrical polarization layer 360.

A method of manufacturing a solar cell according to the present invention is characterized in that an electrical polarization layer is further formed in a typical method of manufacturing a thin film solar cell.

As a method of forming the electrical polarization layer, a physical vapor deposition (PVD) method, such as a typical sputtering method and an evaporation method, or a chemical vapor deposition (CVD) method and an atomic layer deposition (ALD) method may be used.

In a case where the sputtering method among the above methods is used, a target of an electrical polarization material to be formed is installed in a vacuum chamber and an inert gas, such as argon (Ar), is injected in a vacuum state to generate a plasma so that the electrical polarization material discharged by the collision of Ar ions with the target may be formed as a thin film on the light-absorbing layer.

In a case where the evaporation method is used, electrical polarization material powder is charged into an evaporation source holder of a vacuum chamber and atoms of the corresponding material are evaporated by resistance heating so that an electrical polarization layer may be formed on the light-absorbing layer.

Also, in a case where the CVD method is used, an organic metal complex gas including metal is used as a precursor and a thin film of an electrical polarization material, i.e., an electrical polarization layer, may be formed by using an inert gas, such as argon (Ar) gas and nitrogen ($N_2$) gas, as a carrier gas under known chemical vapor deposition conditions.

Furthermore, in a case where the ALD method is used, an electrical polarization layer may be formed to a desired thickness by repeating a cycle including the steps of introducing and adsorbing a raw material precursor of an electrical polarization material, desorbing a by-product using a purge gas and removing a residual gas, supplying a reaction gas to react with the adsorbed material, and desorbing a by-product using a purge gas and removing a residual gas.

A built-in electric field of the electrical polarization material thus formed may further improve the efficiency of the solar cell when remnant polarization is increased by applying a predetermined electric field to both ends of the electrical polarization layer using remnant polarization characteristics of a ferroelectric or antiferroelectric.

Example 1

In Example 1 of the present invention, a CIGS thin film solar cell was manufactured by the following process.

First, a lower electrode was formed by depositing a molybdenum (Mo) layer on a SLG substrate to a thickness of about 1 µm using a sputtering method. Subsequently, a CIGS thin film was deposited to a thickness of about 2 µm to form a light-absorbing layer.

As a method of forming the CIGS light-absorbing layer, there are a co-evaporation method in which deposition is performed by individually and simultaneously evaporating elements, such as Cu, indium (In), gallium (Ga), and selenium (Se), in a high vacuum atmosphere and heating the substrate in a temperature range of 500° C. to 600° C., and a two-stage method in which a precursor including elements, such as Cu, Ga, and In, or a precursor including Cu, Ga, In, and Se is used to form a thin film, and selenization is then performed in a $H_2Se$ gas or Se vapor atmosphere.

Also, as a method of forming the precursor thin film, a vacuum method, such as co-evaporation and sputtering deposition, has been most widely used, but a non-vacuum method, such as electroplating, ink printing, and spray pyrolysis, may also be used in order to reduce process costs.

In Example 1 of the present invention, a CIGS light-absorbing layer was formed by depositing at a substrate temperature of 550° C. for 30 minutes to 60 minutes using a co-evaporation method.

As a method of forming an electrical polarization layer, a method may be used in which a material layer forming electrical polarization is prepared by forming a metal oxide layer on one surface of the light-absorbing layer and then causing a chemical reaction between the light-absorbing layer and the metal oxide layer.

In this case, the metal oxide layer may be formed by a vacuum deposition method such as PVD, CVD, or ALD.

For example, an electrical polarization layer may be formed by the steps of adsorbing a precursor, in which a Ti compound is mixed, on the light-absorbing layer using an ALD method and forming the adsorption layer of the precursor, in which the Ti compound is mixed, as an oxide by oxidation.

Specifically, a $(Cu,Ga,In)Ti_xO_y$, (where x and y are arbitrary positive numbers) complex compound layer may be formed by a method of forming a $TiO_2$ layer on a CIGS layer or causing a chemical reaction to occur between Cu, Ga, and In atoms constituting the CIGS layer and the $TO_2$ layer by a heat treatment after the formation of the $TiO_2$ layer, wherein the complex compound may function as the electrical polarization layer.

Also, in a case where the electrical polarization layer is formed by the atomic layer deposition method, the electrical polarization layer, for example, may be formed by using a precursor in which a Ca compound and/or a Cu compound and a Ti compound are mixed.

In the case that an electrical polarization layer is formed by the atomic layer deposition method using the precursor in which the Ca compound and the Ti compound are mixed, the electrical polarization layer may be formed by including the steps of adsorbing Ca and Ti compound precursor materials on the light-adsorbing layer and forming the adsorption layer of the precursor materials as an oxide by an oxidation reaction.

In this case, at least one material of $Ca(Thd)_2$ $(Tetraen)[=C_{30}H_{61}CaN_5O_4]$ and $Ca_3$ $(thd)_6[=Ca_3(C_{11}H_{20}O_2)_6]$ may be used as the Ca compound precursor, and at least one material of $Ti(O-iPr)_2$ $(DPM)_2[=Ti(C_3H_7O)_2(C_{11}H_{19}O_2)_2]$ and $TiO(thd)_2[=TiO(C_{11}H_{20}O_2)_2]$ may be used as the Ti compound precursor.

Also, in the case in which an electrical polarization layer is formed by the atomic layer deposition method using the precursor in which the Cu compound and the Ti compound are mixed, the electrical polarization layer may be formed by including the steps of adsorbing Cu and Ti compound precursor materials on the light-adsorbing layer and forming the adsorption layer of the precursor materials as an oxide by an oxidation reaction.

In this case, at least one material selected from the group consisting of $Cu(hfac)(tmvs)[=C_{10}H_{13}CuF_6O_2Si]$, $Cu(hfac)_2[=Cu(CF_3COCHCOCF_3)_2]$, $(hfac)Cu(DMB)[=Cu(CF_3COCHCOCF_3[CH_2CHC(CH_3)_3]]$, and $Cu(ethylketoiminate)_2[=Cu(CH_3COCHCN(CH_2CH_3)CH_3)]_2]$ may be used as the Cu compound precursor, and at least one material of $Ti(O-iPr)_2(DPM)_2[=Ti(C_3H_{70})_2(C_{11}H_{19}O_2)_2]$ and $TiO(thd)_2[=TiO(C_{11}H_{20}O_2)_2]$ may be used as the Ti compound precursor.

In Example 1 of the present invention, through a process of depositing a $TiO_2$ thin film on a CIGS layer at a temperature of 200° C. or more using an atomic layer deposition method or depositing a $TiO_2$ thin film at a temperature of 200° C. or less and then heat treating the $TiO_2$ thin film at a temperature of 200° C. or more, an electrical polarization layer, which was formed of a metal oxide including $CuTiO_3$ and $GaTiO_3$, was formed by interdiffusion and chemical reaction between Cu, Ga, and/or In atoms constituting the CIGS layer.

Specifically, in the case that the $TiO_2$ thin film was formed, tetrakis(dimethylamino)titanium (TDMAT:$Ti[N(CH_3)_2]_4$), tetrakis(diethylamido)titanium (TDEAT:$Ti[N(C_2H_5)_2]_4$), tetrakis(ethylmethylamido) titanium (TEMAT:$Ti[N(C_2H_5)(CH_3)]_4$), or titanium tetraisopropoxide (TTIP:$Ti[OCH(CH_3)_2]_4$) may be used as the Ti compound precursor.

In the atomic layer deposition step, a process, which was divided into 4 sections by time period, was repeatedly performed.

First, a $TiO_2$ thin film or an oxide layer of a Ti compound was formed by including the steps of forming an adsorption layer of a precursor material (Ti compound) by adsorbing the precursor material using a Ti compound precursor by using Ar as a dilution gas ($1^{st}$ step), removing a by-product and a residual gas using Ar gas ($2^{nd}$ step), causing an oxidation reaction with the adsorption layer by generating a plasma while injecting oxygen ($3^{rd}$ step), and removing a by-product and a residual gas using Ar gas ($4^{th}$ step).

For example, an electrical polarization material may be formed to a thickness of 50 nm according to a deposition thickness and a deposition rate (about 0.1 nm/sec) when the $1^{st}$ step, the $2^{nd}$ step, the $3^{rd}$ step, and the $4^{th}$ step were respectively performed for 0.3 seconds to 5 seconds, 10 seconds to 20 seconds, 3 seconds to 5 seconds, and 10 seconds to 20 seconds, the above four steps were included in a single cycle, and the cycle were repeated 100 to 500 times at a reaction temperature of 100° C. to 300° C.

Preferably, an electrical polarization layer, which was formed of an oxide of a Ti compound having a thickness of about 50 nm, was formed by chemically reacting a CIGS layer and $TiO_2$ which was formed by repeating an atomic layer deposition cycle, which was composed of performing the $1^{st}$ step for 1 second, the $2^{nd}$ step for 10 seconds, the $3^{rd}$ step for 3 seconds, and the $4^{th}$ step for 5 seconds, 500 times at 200° C. In this case, in each step, a gas injection rate of 50 sccm may be used, and hydrogen ($H_2$) gas may also be simultaneously used with the Ti compound precursor in the $1^{st}$ step.

Figure 9:
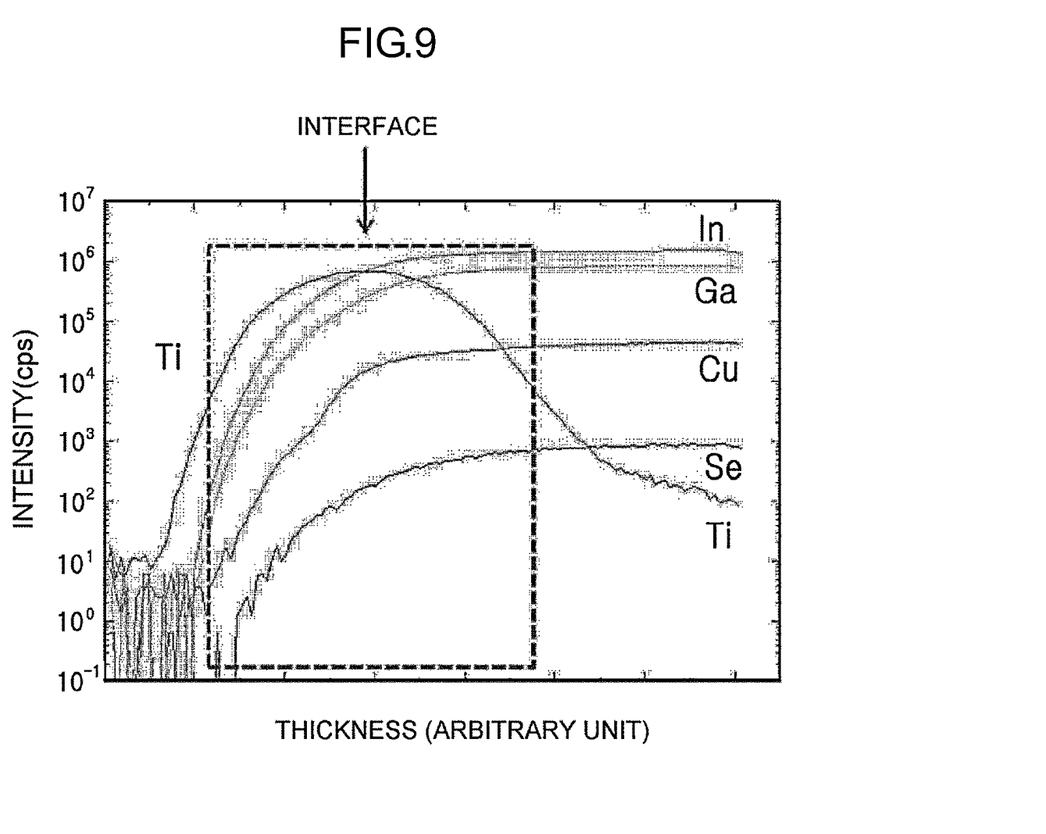
FIG. 9, as the results of secondary ion mass spectrometry (SIMS), illustrates changes in composition with respect to a thickness of an electrical polarization layer according to an embodiment of the present invention.

FIG. 9 are the results of measuring changes in composition with respect to a thickness of the CIGS thin film and electrical polarization layer, which were manufactured according to Example 1 of the present invention, by secondary ion mass spectrometry (SIMS), and illustrates that the electrical polarization layer formed of a [$(Cu,Ga,In)Ti_xO_y$] mixed oxide was widely formed at an interface by interdiffusion and chemical reaction between the $TiO_2$ layer and Cu, Ga, and In atoms in the CIGS thin film during the deposition of the $TiO_2$ thin film at 200° C.

Although only a single electrical polarization layer was disposed between the light-absorbing layer and the electrode in Example 1 of the present invention, but two or more electrical polarization layers may be used in a single solar cell, for example, built-in electric fields may be formed at both sides by respectively introducing the electrical polarization layers adjacent to both electrodes with respect to the direction of electron collection and the direction of hole collection.

Similar to a typical CIGS solar cell, a buffer layer formed of an about 50 nm thick CdS layer may be formed on the electrical polarization layer. However, since the electrical polarization layer according to Example 1 of the present invention may also function as a buffer layer, a CdS layer was not formed because it was desirable in terms of process costs that the CdS layer was not formed.

Finally, a window layer was formed by depositing an indium tin oxide (ITO) layer on the electrical polarization layer to a thickness of about 0.5 μm, and a CIGS thin film solar cell was completed by forming an upper electrode by forming an aluminum (Al) grid layer on the window layer.

The electrical polarization layer of the CIGS thin film solar cell thus manufactured forms a built-in electric field by spontaneous polarization.

The following Table 1 illustrates the results of evaluating characteristics of the CIGS thin film solar cell which was manufactured according to Example 1 of the present invention.

TABLE 1

| Items (unit) | Measurements |
|---|---|
| Voc (V) | 1.05 |
| Isc (mA) | 659.3 |
| Jsc (mA/cm$^2$) | 105.5 |
| Fill factor (%) | 38.3 |
| Efficiency (%) | 42.4 |

As confirmed in Table 1, the CIGS thin film solar cell, which was manufactured according to Example 1 of the present invention, exhibited a high photoelectric conversion efficiency of 42% or more.

Also, with respect to the solar cell according to Example 1 of the present invention, since current was generated when an electric field was applied from the outside regardless of forward or backward, the electrical polarization layer provided a built-in electric field and simultaneously functioned as a tunneling dielectric (or capacitor) with respect to charge carriers.

In particular, in addition to spontaneous polarization characteristics, the electrical polarization layer may increase remnant polarization when a forward electric field was applied to both ends of the electrical polarization layer using an external voltage source and thus, the electrical polarization layer may increase the forward electric field with respect to the charge carriers by photoexcitation.

Comparative Example

In Comparative Example of the present invention, a CIGS thin film solar cell having the same structure as Example 1 was formed, wherein other parts excluding an electrical polarization layer were manufactured in the same manner as in Example 1.

Herein, in forming the electrical polarization layer, in order to identify an electrical polarization effect, it was confirmed whether the electrical polarization effect was decreased by disposing an insulation thin-film layer before the formation of the electrical polarization layer. As the insulation thin-film layer, an $Al_2O_3$ thin film, as an insulation material, was formed to a thickness of about 10 nm by an atomic layer deposition method using an Al compound precursor.

In this case, when using the ALD process, at least one selected from the group consisting of aluminum hydride ($AlH_3$), trimethylaluminum (($CH_3$)$_3$Al), dimethyl aluminum hydride (($CH_3)_2AlH$), and dimethylethylamine alane ($[(CH_3)_2C_2H_5N]AlH_3$) was used as the Al compound precursor.

Similar to Example 1, the atomic layer deposition step was performed by dividing into 4 sections by time period, and specifically, an $Al_2O_3$ thin film was formed by a $1^{st}$ step of adsorbing an Al-precursor using Ar as a dilution gas, a $2^{nd}$ step of removing a by-product and a residual gas using Ar gas, a $3^{rd}$ step of causing an oxidation reaction by generating an oxygen plasma, and a $4^{th}$ step of removing a by-product and a residual gas using Ar gas. Hydrogen ($H_2$) gas may also be simultaneously used with the Al compound precursor in the $1^{st}$ step.

In this case, an insulation thin-film layer may be formed to a thickness of 10 nm to 20 nm according to a deposition thickness and a deposition rate (about 0.2 nm/sec) when the $1^{st}$ step, the $2^{nd}$ step, the $3^{rd}$ step, and the $4^{th}$ step were respectively performed for 0.3 seconds to 5 seconds, 10 seconds to 20 seconds, 3 seconds to 5 seconds, and 10 seconds to 20 seconds, the above four steps were included in a single cycle, and the cycle were repeated 50 to 100 times at a reaction temperature of 100° C. to 300° C. In the present comparative example, a thin-film layer formed of $Al_2O_3$ having a thickness of about 10 nm may be formed by repeating an atomic layer deposition cycle, which was composed of performing the $1^{st}$ step for 0.1 seconds, the $2^{nd}$ step for 10 seconds, the $3^{rd}$ step for 3 seconds, and the $4^{th}$ step for 5 seconds, 50 times at 100° C.

Thereafter, similar to Example 1, an electrical polarization layer was formed on the $Al_2O_3$ insulation thin-film layer by an atomic layer deposition method using a Ti compound precursor, and as a result, a solar cell was manufactured in which the about 10 nm thick $Al_2O_3$ insulation thin-film layer and the electrical polarization layer of a $[(Cu,Ga,In)Ti_xO_y]$ mixed oxide were formed.

The solar cell thus manufactured had an efficiency (%) of 3.3% which was considerable lower than that of Example 1. This may be considered due to the fact that the formation of the electrical polarization layer was reduced according to the disposition of the insulation thin-film layer.

The following Table 2 illustrates the results of measuring photocurrent after remnant polarization was formed by applying a backward voltage to the solar cell which was manufactured according to the comparative example, and as illustrated in Table 2, a phenomenon was observed in which the photocurrent of the solar cell was rapidly increased when applying a backward voltage of −5 V. This phenomenon was considered due to an increase in the remnant polarization of the electrical polarization layer which was formed in the solar cell.

As described above, the efficiency of a solar cell may be improved when a backward voltage is applied to the solar cell having an electrical polarization layer within a range of increasing remnant polarization.

TABLE 2

| Applied voltage (V) | −0.2 | −2 | −5 |
|---|---|---|---|
| Photocurrent (mA) | 52.5 | 38.7 | 554.6 |

When a reverse bias to the solar cell was increased in a dark state in which sunlight irradiation was absent, a breakdown voltage was present in which the cell was destructed while a leakage current was rapidly increased, wherein, according to experiments, a value between −3 V and −7 v was obtained depending on the cell. Thus, an infinitely high value of the backward voltage for increasing the electrical polarization may not be applied and the backward voltage applied must be less than the breakdown voltage of the solar cell.

Example 2

Although the solar cell was manufactured by using a vacuum deposition method in Example 1 of the present invention, but a solar cell may be formed by using a non-vacuum deposition method such as chemical bath deposition (CBD), spin coating, doctor-blade coating, drop-casting, screen printing, and inkjet printing, and a solar cell according to Example 2 of the present invention may include an electrical polarization layer which was formed by a wet coating method.

First, a lower electrode was formed on a SLG substrate by coating the substrate with an Ag or Cu layer to a thickness of about 1 μm using a spin coating method. Subsequently, in order to manufacture CIGS formed of a semiconductor having a p-n junction structure, a precursor solution including constituent elements, such as Cu, In, Ga, Se, and sulfur (S), was prepared, and a light-absorbing layer was formed to a thickness of about 3 μm by coating the substrate with the precursor solution by spin coating or doctor-blade coating and performing a heat treatment.

The precursor material, as a compound raw material, may include a solution in which $CuAc_2H_2O$, $InAc_3$, and $GaCl_3$ were dissolved in ethanol and ethylene glycol, a solution in which $CuCl_22H_2O$, $InCl_3$, $GaCl_3$, and Se raw materials were dissolved in diethylamine, a mixed solution of a pyridine solution, in which CuI or $[Cu(CH_3CN)_4](BF_4)_2$, $InI_3$, and $GaI_3$ were dissolved, and a methanol solution in which $Na_2Se$ was dissolved, or a hydrazine solution in which raw materials, such as $Cu_2S$, $In_2Se_3$, Ga, S, and Se, were dissolved.

For example, a precursor solution including constituent elements, such as Cu, Ti, and O, was prepared, and an electrical polarization layer may be formed by forming a thin-film layer on the substrate by wet coating and performing a heat treatment. In this case, a CIGS thin film solar cell having an electrical polarization material may be manufactured by the following steps.

Specifically, an electrical polarization layer was formed by forming a $CuTiO_3$ thin film on the surface of the light-absorbing layer to a thickness of about 10 nm to about 100 nm by using a spin coating method. In this case, at least one material of $CuAc_2H_2O$, $CuCl_22H_2O$, CuI, and $[Cu(CH_3CN)_4](BF_4)_2$ was used as a Cu precursor, and at least one material of titanium chloride ($TiCl_4$), titanium isoproxide ($Ti[OCH(CH_3)_2]_4$), and titanium butoxide ($Ti(O(CH_2)_3CH_3)_4$) was used as a Ti precursor. The precursors were diluted with ethanol or iso-propanol to have a concentration of 1 M, a solution was formed by mixing a diluted nitric acid solution with a pH of 1.5 or more and IPA therewith, and a $(Cu,Ti)_xO_y$ thin film may be formed by including $CuTiO_3$ through an oxidation/reduction reaction.

Finally, an upper electrode was formed by forming an Ag layer on the electrical polarization layer to a thickness of about 1 μm by a screen printing method, and thus, a CIGS thin film solar cell was completed.

Example 3

In Examples 1 and 2 of the present invention, the case of forming an electrical polarization layer in a solar cell was described as an example, but an electrical polarization layer may be connected to the outside of the solar cell in series. That is, in a typical solar cell structure composed of substrate-lower electrode-light-absorbing layer (or p-n junction semiconductor layer)-upper electrode, when an electrical polarization layer is formed between the substrate and the lower electrode, above the upper electrode, or at both sides thereof so as to be connected to the electrode in series, an effect of applying a forward electric field to electrons and holes, which are collected in a solar cell, may be obtained by using spontaneous polarization of the electrical polarization layer or using remnant polarization which is formed by applying an electric field to the electrical polarization layer.

Even in this case, the above-described method of forming an electrical polarization layer may be used in the same manner, but, in order to apply the electric field to the electrical polarization layer, a step of further forming electrodes may be included so as to connect the electrodes respectively to top and bottom surfaces of the electrical polarization layer. In this case, the thickness or tunneling characteristics of the electrical polarization layer is not particularly limited.

Also, the electrical polarization material may be used in all solar cell structures in which a light-absorbing layer is composed of one material of a p-type semiconductor, an n-type semiconductor, and an i-type (intrinsic) semiconductor, or a combination thereof.

The solar cell structure having a built-in electric field as described above may also be used in other thin film type solar cells using a substrate, such as a silicon (Si) thin film solar cell, a dye-sensitized solar cell, and an organic solar cell, or a typical solar cell, such as a crystalline solar cell, for the same effect.

Although preferred embodiments of the present invention have been described above, the scope of the present invention is not limited to the embodiments. Various modifications of the embodiments may be made without departing from the spirit and scope of the invention as defined by the appended claims, and the modifications are included in the scope of the present invention.

DESCRIPTION OF THE SYMBOLS

100, 200, 300: Solar cell
110, 210, 310: Substrate
120, 220, 320: Lower electrode
130, 230, 330: Light-absorbing layer
140, 240, 340: Electrical polarization layer
150, 250, 350: Upper electrode

The invention claimed is:

1. A method of manufacturing a solar cell, comprising:
    forming a light-absorbing layer between two electrodes which are disposed to face each other; and
    forming an electrical polarization layer having a thickness of 10 nm to 100 nm, which includes an electrical polarization material forming a built-in electric field, on the light-absorbing layer, wherein the solar cell is free from a buffer layer as replaced by the electrical polarization layer,
    wherein the electrical polarization layer is formed by a process comprising:
        forming a metal oxide layer on one surface of the light-absorbing layer; and
        causing a chemical reaction between the light-absorbing layer and the metal oxide layer, the chemical reaction forming the electrical polarization material of the electrical polarization layer,
    wherein the metal oxide layer is comprised of a metal oxide having a compound including titanium(Ti) or both of titanium(Ti) and copper(Cu).

2. The method of claim 1, wherein the built-in electric field is increased by applying an electric field to both opposite upper and lower surfaces of the electrical polarization layer.

3. The method of claim 2, wherein the electric field applied to increase the built-in electric field is less than a reverse breakdown voltage of the solar cell.

4. The method of claim 1, wherein the electrical polarization layer is formed by physical vapor deposition (PVD), chemical vapor deposition (CVD), atomic layer deposition (ALD), or a wet coating method.

5. The method of claim 4, wherein, in a case where the electrical polarization layer is formed by the atomic layer deposition, the electrical polarization layer is formed by a process comprising:
    adsorbing one or both of a calcium (Ca) compound precursor material and a copper (Cu) compound precursor material in addition to a titanium (Ti) compound precursor material to the light-absorbing layer; and
    forming an adsorption layer of the precursor materials as an oxide by an oxidation reaction.

6. The method of claim 5, wherein the Ca compound precursor material comprises at least one selected from $Ca(Thd)_2(Tetraen)[=C_{30}H_{61}CaN_5O_4]$ and $Ca_3(thd)_6$ $[=Ca_3(C_{11}H_{20}O_2)_6]$.

7. The method of claim 5, wherein the Cu compound precursor material comprises at least one selected from the group consisting of $Cu(hfac)(tmvs)[=C_{10}H_{13}CuF_6O_2Si]$, $Cu(hfac)_2[=Cu(CF_3COCHCOCF_3)_2]$, $(hfac)Cu(DMB)[=Cu(CF_3COCHCOCF_3)[CH_2CHC(CH_3)_3]]$, and $Cu(ethylketoiminate)_2[=Cu(CH_3COCHCN(CH_2CH_3)CH_3)]_2]$.

8. The method of claim 5, wherein the Ti compound precursor material comprises at least one selected from $Ti(O-iPr)_2(DPM)_2[=Ti(C_3H_7O)_2(C_{11}H_{19}O_2)_2]$ and $TiO(thd)_2[=TiO(C_{11}H_{20}O_2)_2]$.

9. The method of claim 4, wherein the wet coating method comprises at least one selected from the group consisting of chemical bath deposition, spin coating, doctor-blade coating, drop-casting, screen printing, and inkjet printing.

10. The method of claim 4, wherein the wet coating method comprises:
    preparing a solution in which a metal oxide is dissolved;
    coating the solution; and
    performing a heat treatment.

11. The method of claim 10, wherein the metal oxide is a compound including Ti.

12. The method of claim 10, wherein the metal oxide is a compound including Ti and Cu.

13. The method of claim 1, wherein the metal oxide layer is formed by atomic layer deposition using a precursor material including Ti.

14. The method of claim 13, wherein the precursor material including Ti comprises tetrakis(dimethylamino)titanium, tetrakis(diethylamido)titanium, tetrakis(ethylmethylamido)titanium, tetraisopropoxide, or a combination thereof.

* * * * *